United States Patent
Itoh

(10) Patent No.: US 12,551,904 B2
(45) Date of Patent: Feb. 17, 2026

(54) CENTRIFUGAL SEPARATION APPARATUS AND CENTRIFUGAL SEPARATION METHOD

(71) Applicant: Aoi Seiki Co., Ltd., Kumamoto (JP)

(72) Inventor: Teruaki Itoh, Kumamoto (JP)

(73) Assignee: Aoi Seiki Co., Ltd., Kumamoto (JP)

( * ) Notice: Subject to any disclaimer, the term of this patent is extended or adjusted under 35 U.S.C. 154(b) by 786 days.

(21) Appl. No.: 17/805,576

(22) Filed: Jun. 6, 2022

(65) Prior Publication Data

US 2022/0388017 A1   Dec. 8, 2022

(30) Foreign Application Priority Data

Jun. 7, 2021   (JP) .................................. 2021-095245

(51) Int. Cl.
*B04B 13/00* (2006.01)
*B04B 7/08* (2006.01)

(52) U.S. Cl.
CPC ................ *B04B 13/00* (2013.01); *B04B 7/08* (2013.01); *B04B 2013/006* (2013.01)

(58) Field of Classification Search
CPC ..... B04B 13/00; B04B 7/08; B04B 2013/006; B04B 7/06; B04B 2011/046; B04B 5/0421; B04B 11/04; G01N 2035/0091; G01N 35/00871; G01N 35/0099; G01N 35/04; G01N 2035/00495
See application file for complete search history.

(56) References Cited

U.S. PATENT DOCUMENTS

| | | | |
|---|---|---|---|
| 5,168,766 A | 12/1992 | Stoffel | |
| 7,195,737 B2 | 3/2007 | Itoh | |
| 2004/0089737 A1 | 5/2004 | Itoh | |
| 2020/0005479 A1* | 1/2020 | Stanton | A61M 1/36225 |

(Continued)

FOREIGN PATENT DOCUMENTS

| | | | |
|---|---|---|---|
| CN | 212237770 U | * | 12/2020 |
| JP | 2003-305382 A | | 10/2003 |
| JP | 2004-151024 A | | 5/2004 |

(Continued)

OTHER PUBLICATIONS

Japanese Office Action Issued in JP Patent Application No. 2021-095245, dated Nov. 26, 2024, in 10 pages.

(Continued)

*Primary Examiner* — Jennifer Wecker
*Assistant Examiner* — Britney N. Washington
(74) *Attorney, Agent, or Firm* — Knobbe, Martens, Olson & Bear, LLP

(57) ABSTRACT

According to an embodiment, a centrifugal separation apparatus includes, a centrifugal separator comprising a retainer and a rotating member for rotation of the retainer, the retainer adapted to retain a workpiece, an imaging unit configured to acquire a detection image of an installation position at which the retainer is placed, a transfer mechanism configured to move the workpiece into the centrifugal separator, and a sensor processing unit configured to detect, based on the detection image acquired after an installation process of placing the workpiece into the retainer and before a rotation process of rotating the rotating member, a state of the workpiece subjected to the installation process.

12 Claims, 15 Drawing Sheets

(56) References Cited

U.S. PATENT DOCUMENTS

2020/0206740 A1   7/2020   Chiu et al.
2022/0172341 A1   6/2022   Kakishita et al.

FOREIGN PATENT DOCUMENTS

| JP | 2011-110467 A | 6/2011 |
| JP | 2015-087265 | 5/2015 |
| TW | 201920928 A | 6/2019 |
| WO | WO 2017/181077 A1 | 10/2017 |
| WO | WO 2020/208899 A1 | 10/2020 |

OTHER PUBLICATIONS

Office Action received in Taiwanese Application No. 111120719, dated Dec. 30, 2022.
Extended European Search Report in Application No. 22176458.2, dated Nov. 8, 2022.
Office Action issued in Japanese Patent Application No. 2021-095245 dated Apr. 8, 2025 in 8 pages.
Office Action issued in Chinese Patent Application No. 202210636559.8, dated Jul. 18, 2025 in 23 pages.
Bi Xin, "Environmental Perception Technology for Autonomous Unmanned Systems", Huazhong University of Science and Technology Press, May 2020, pp. 89-90.
Office Action issued in Chinese Patent Application No. 202210636559.8, dated Oct. 31, 2025 in 25 pages.
Rong et al., "Medical Laboratory Instrumentation," Huazhong University of Science and Technology Press, 2021, pp. 245-247.

\* cited by examiner

< ST2 >

< ST3 >

< ST4,ST5,ST6 >

< ST6 >

CENTRIFUGAL SEPARATION APPARATUS AND CENTRIFUGAL SEPARATION METHOD

CROSS-REFERENCE TO RELATED APPLICATIONS

This application is based upon and claims the benefit of priority from prior Japanese Patent Application No. 2021-095245, filed Jun. 7, 2021, the entire contents of which are incorporated herein by reference.

BACKGROUND

1. Field

The present invention relates generally to a centrifugal separation apparatus and a centrifugal separation method.

2. Description of the Related Art

As a centrifugal separation apparatus for the centrifugal separation of samples such as blood, an apparatus of, for example, the following type is available. The apparatus includes a disk-shaped rotating member in a housing, and multiple buckets are swingably attached to the peripheral portion of the rotating member. The centrifugal separation process is conducted by putting sample containers containing subject samples into these buckets and causing the rotating member to rotate at high speed (Jpn. Pat. Appln. KOKAI Publication No. 2004-151024).

In an exemplary operation, the sample containers are sequentially installed in the rotating bodies of multiple centrifugal separators from a processing line, where the samples are subjected to biochemical analysis and various pre-processes, etc. The centrifugal separation process is initiated by rotating the rotating bodies of the centrifugal separators. Upon carrying out the centrifugal separation process for a predetermined period, the rotating bodies are stopped and the sample containers are sequentially taken out and returned to the processing line.

In such a centrifugal separation apparatus, if the rotating operation is conducted without the sample containers being properly installed in the rotating bodies, a malfunction of the apparatus or damage to the samples could be incurred. It is therefore desirable that the installation state of the sample containers be checked. However, a centrifugal separator involves high-speed rotation of the rotating member within it, which makes it difficult to arrange an internal sensor. Due to this, means adopted for checking the sample containers include a short-range detection technique utilizing a photoelectric sensor, in which the photoelectric sensor is arranged on, for example, an arm for installation operation and detects whether or not the sample container is grasped by the arm before installation. As such, it is difficult to detect installation errors.

SUMMARY

According to an embodiment, a centrifugal separation apparatus comprises, a centrifugal separator comprising a retainer and a rotating member for rotation of the retainer, the retainer adapted to retain a workpiece, an imaging unit configured to acquire a detection image of an installation position at which the retainer is placed, a transfer mechanism configured to move the workpiece into the centrifugal separator, and a sensor processing unit configured to detect, based on the detection image acquired after an installation process of placing the workpiece into the retainer and before a rotation process of rotating the rotating member, a state of the workpiece subjected to the installation process.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Figure 1:
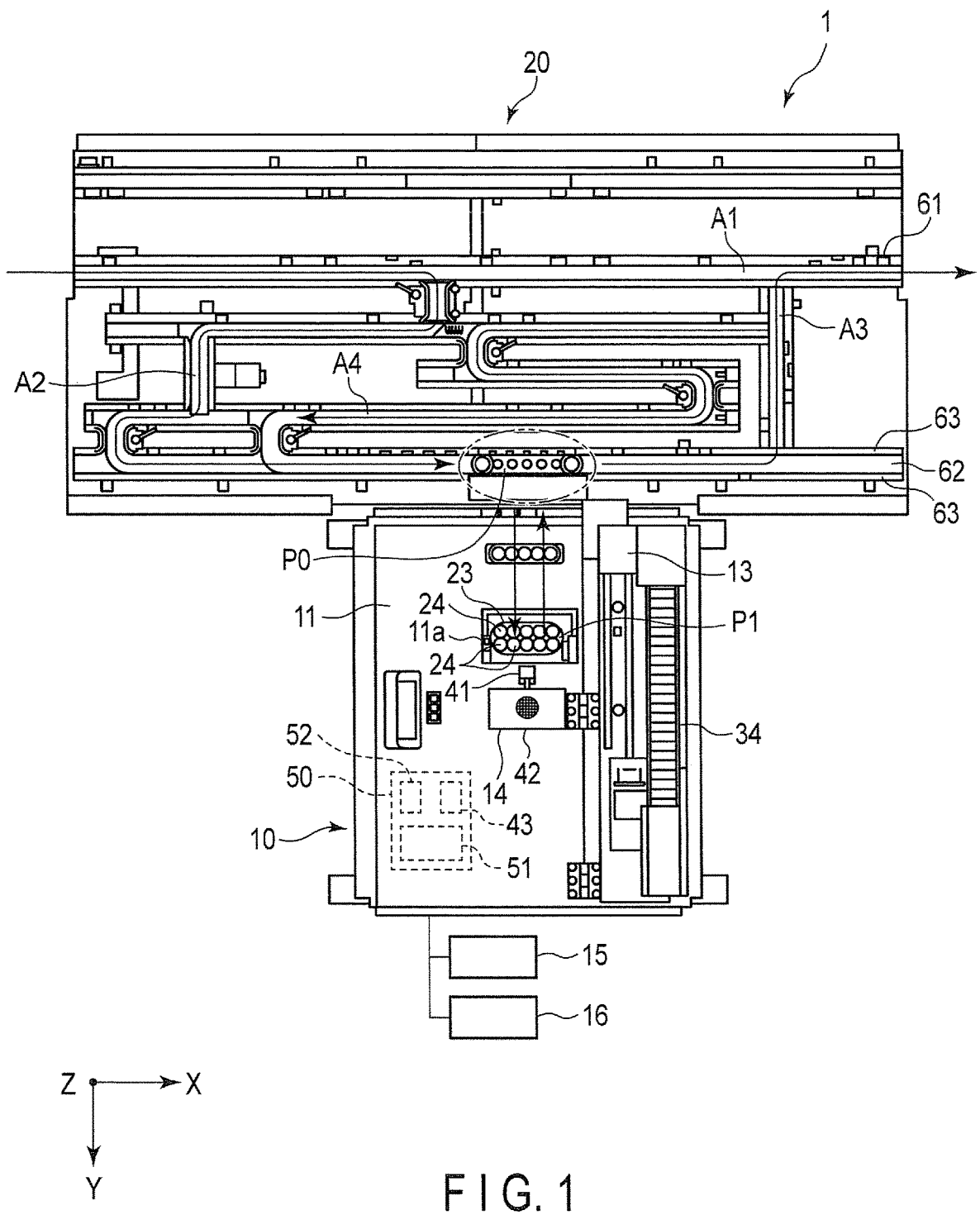
FIG. 1 is a plan view of a sample processing apparatus according to an embodiment of the invention.
Figure 2:
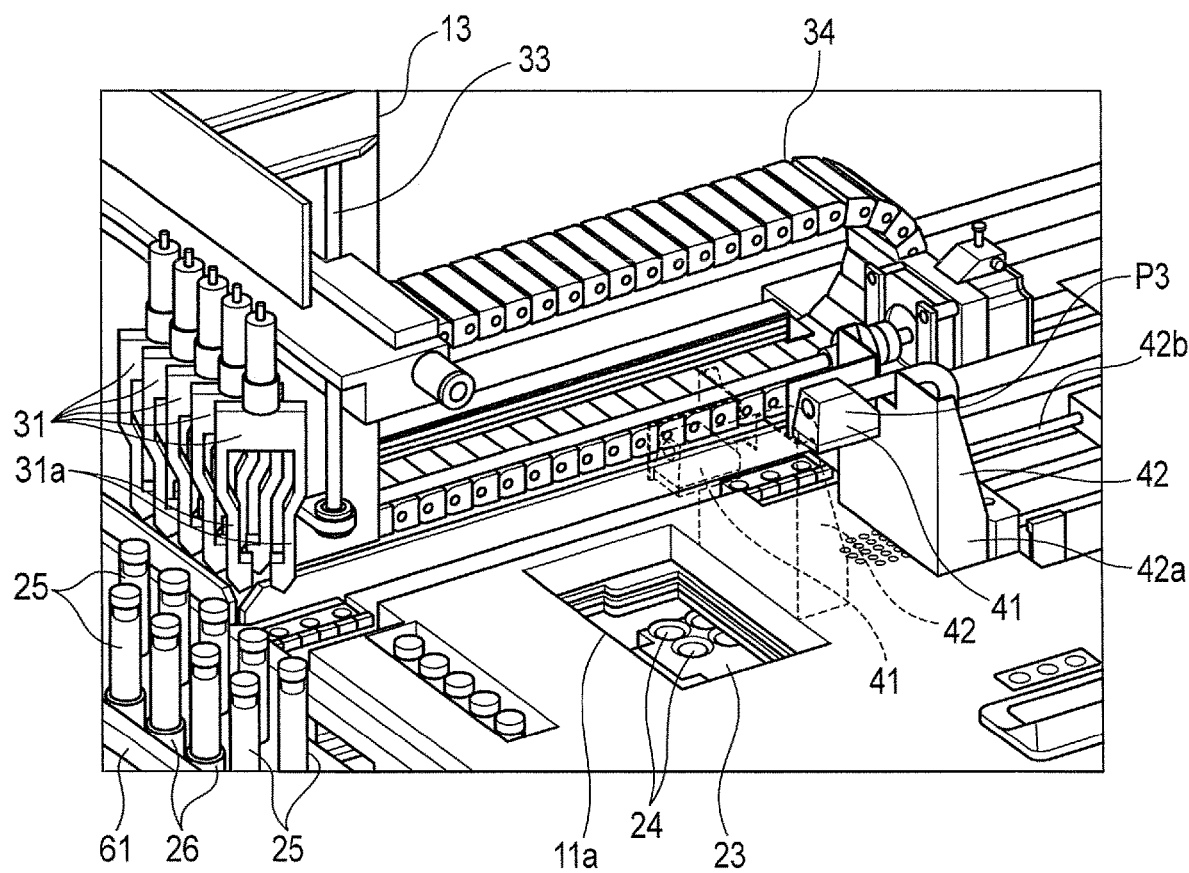
FIG. 2 is a perspective view showing a part of the sample processing apparatus.
Figure 3:
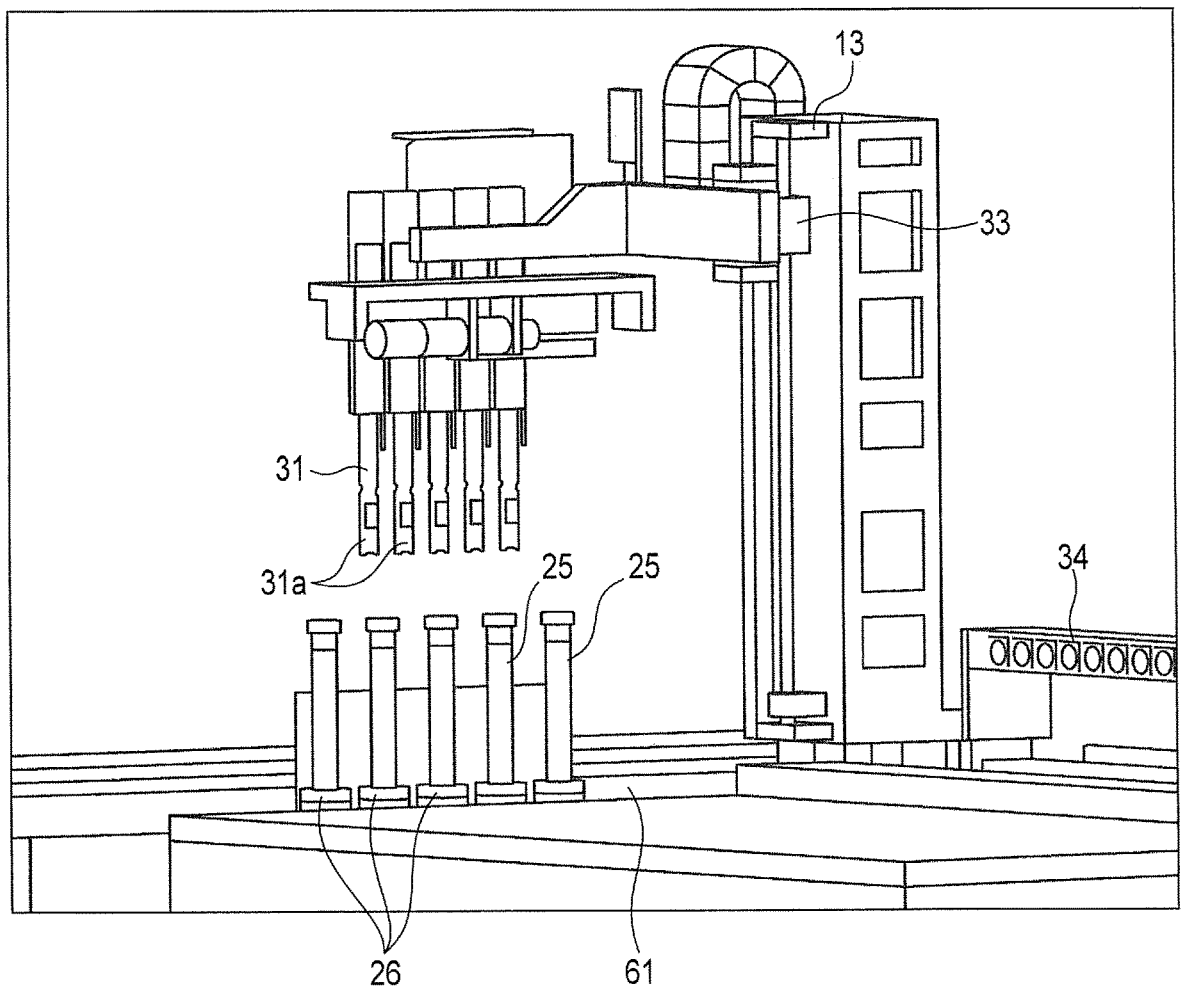
FIG. 3 is a perspective view showing a part of the sample processing apparatus.
Figure 4:
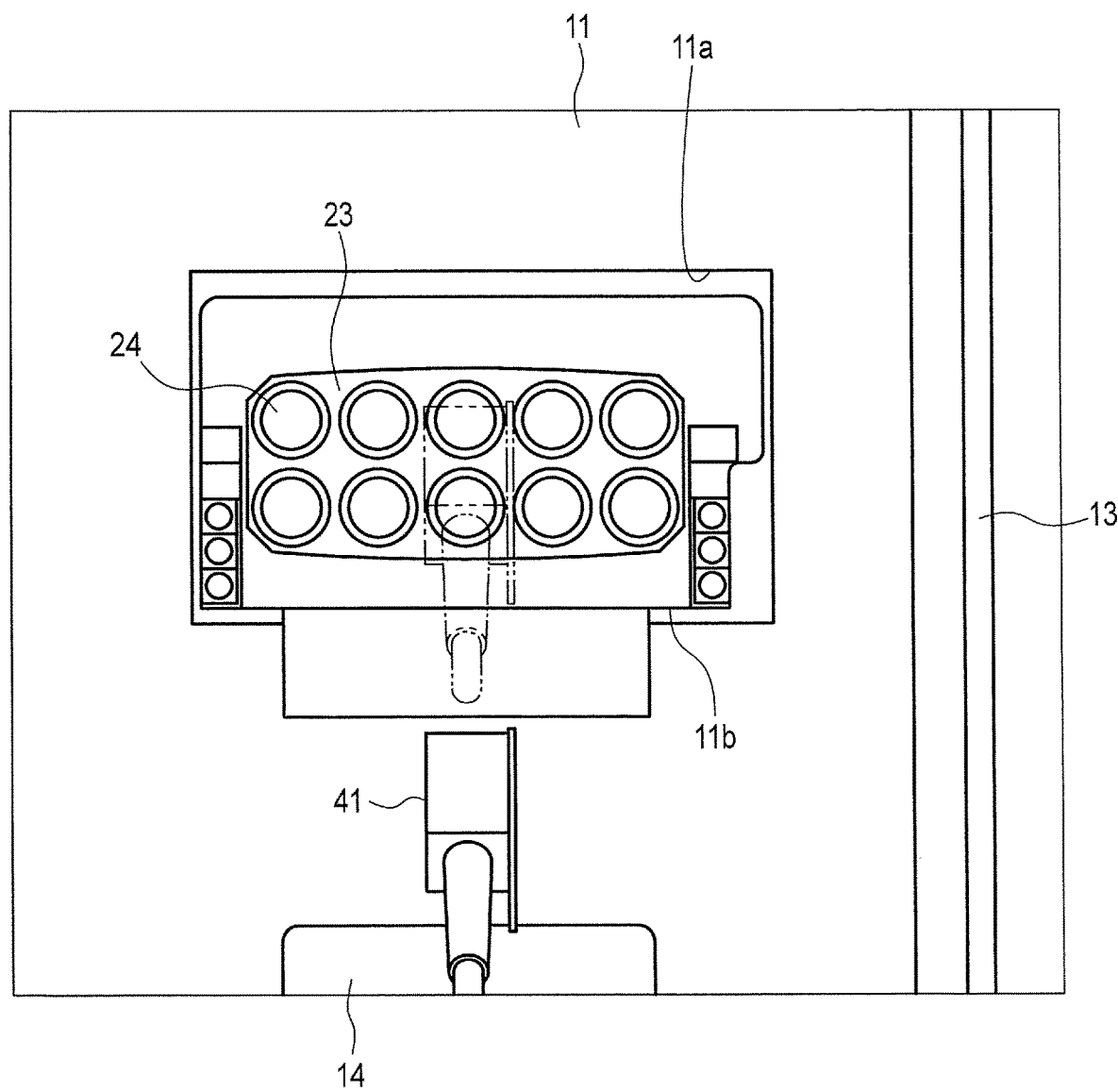
FIG. 4 is a plan view showing a part of a centrifugal separator of the sample processing apparatus.
Figure 5:
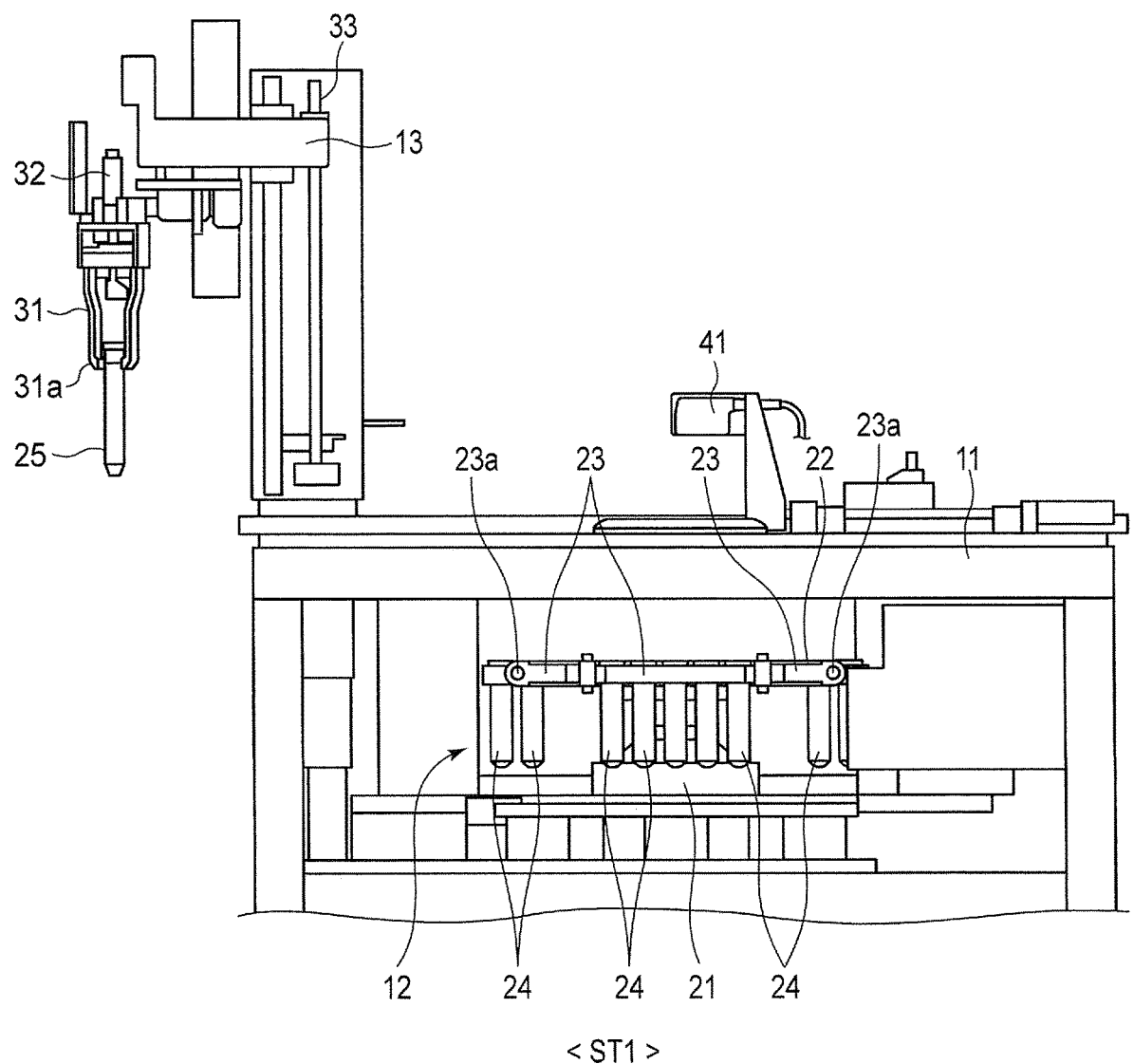
FIG. 5 is a diagram for explaining an installation process by a sample processing method according to the embodiment.
Figure 6:
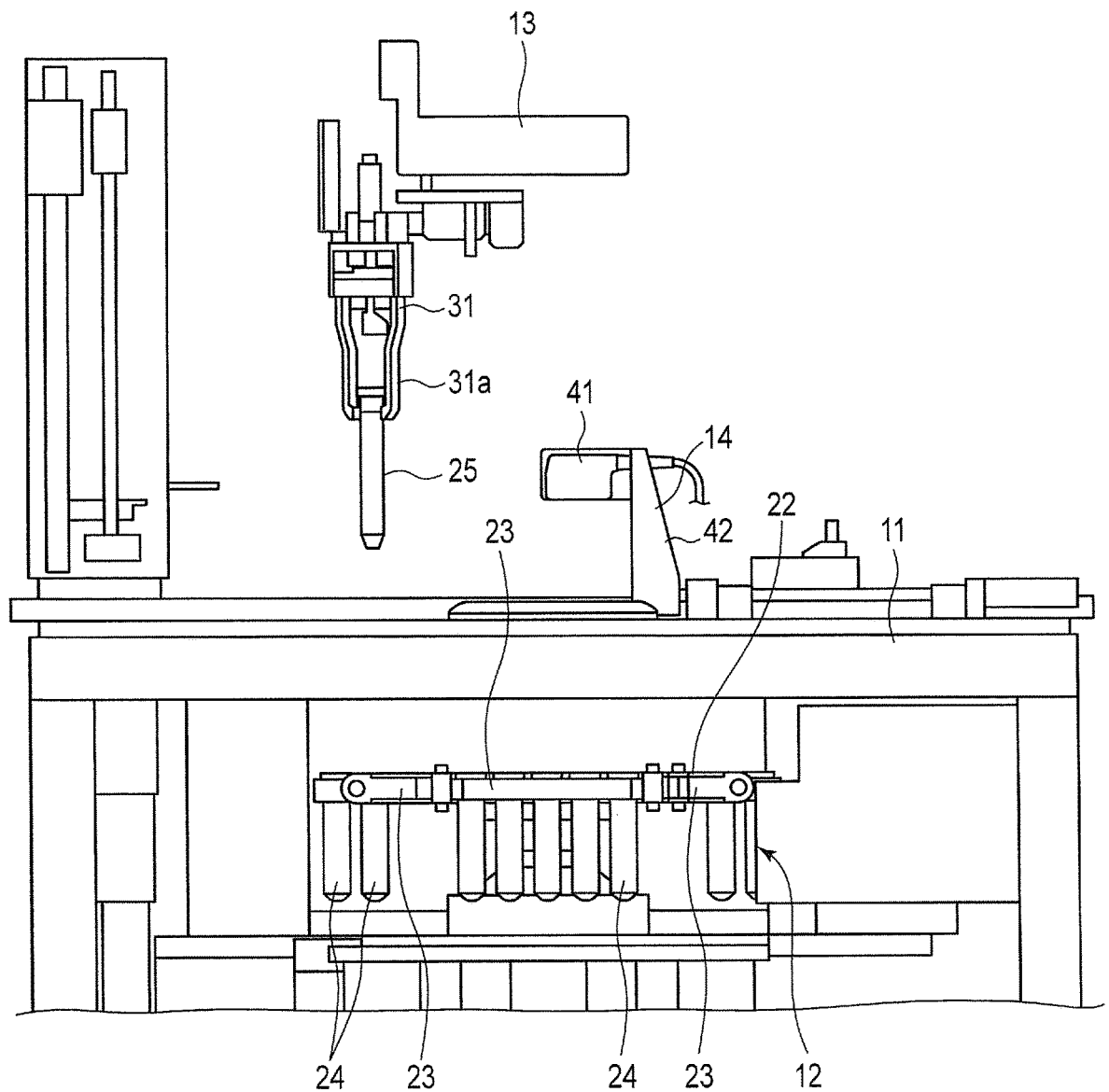
FIG. 6 is a diagram for explaining the installation process by the sample processing method.
Figure 7:
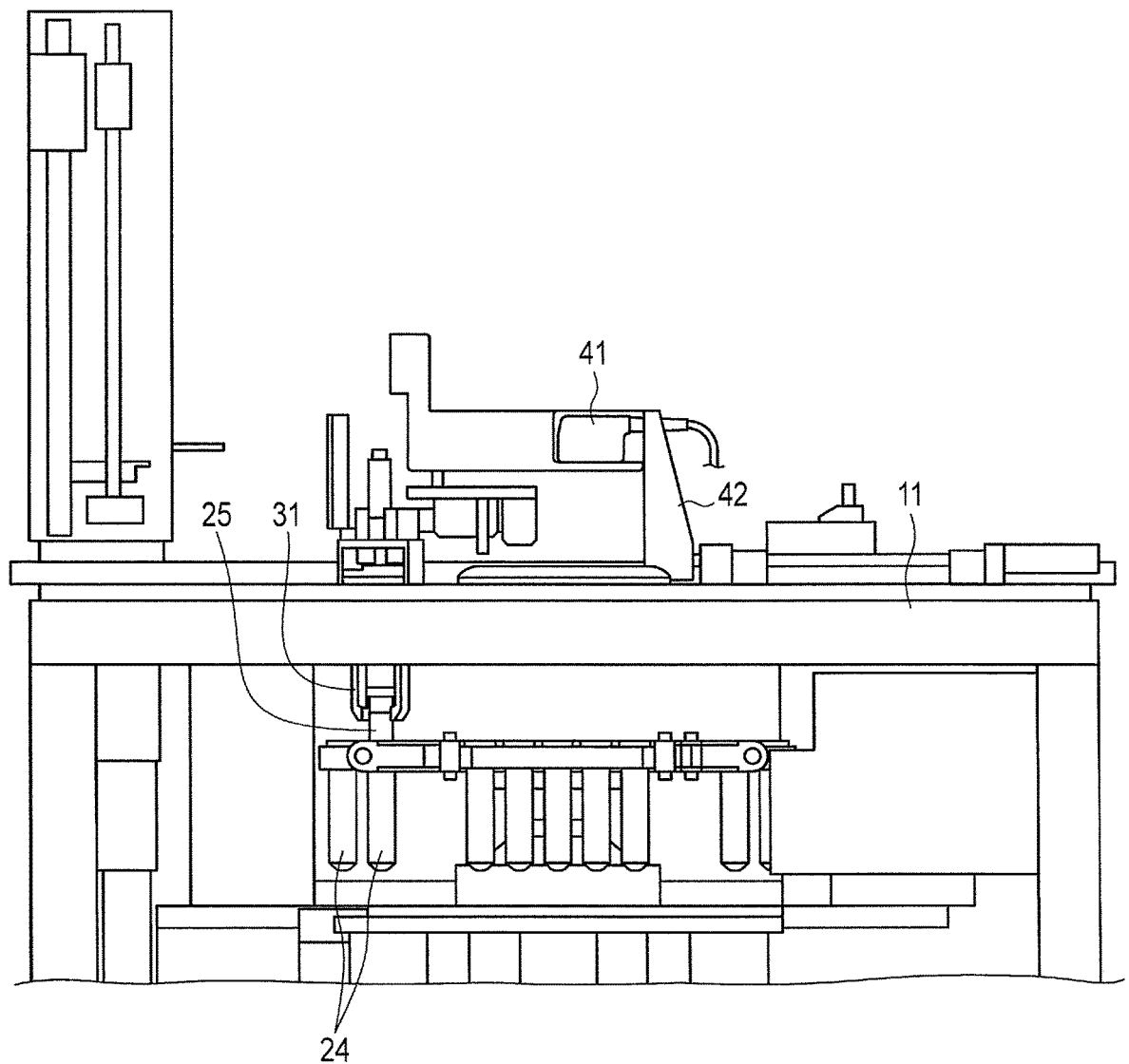
FIG. 7 is a diagram for explaining an imaging process by the sample processing method.
Figure 8:
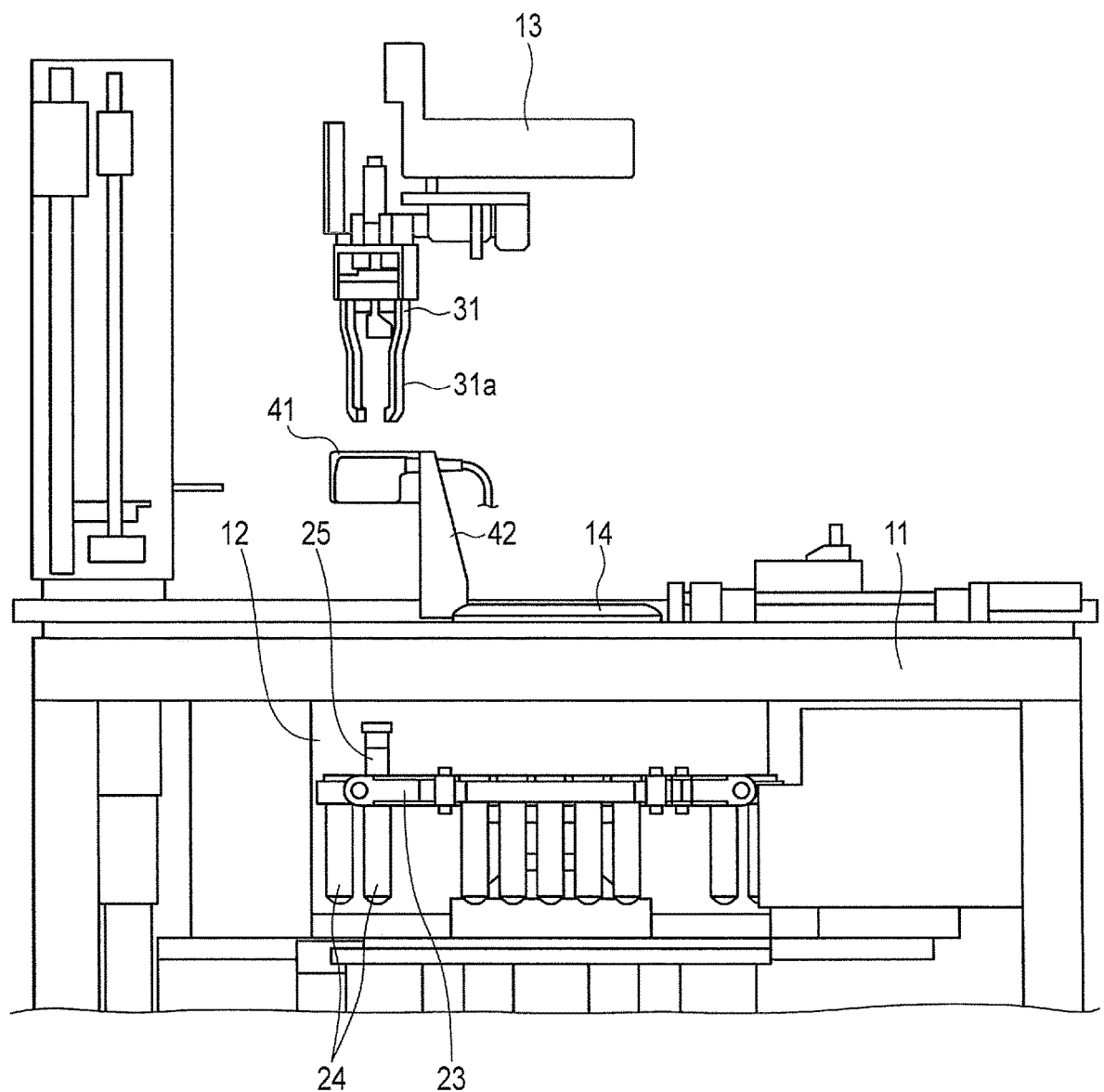
FIG. 8 is a diagram for explaining the imaging process by the sample processing method.
Figure 9:
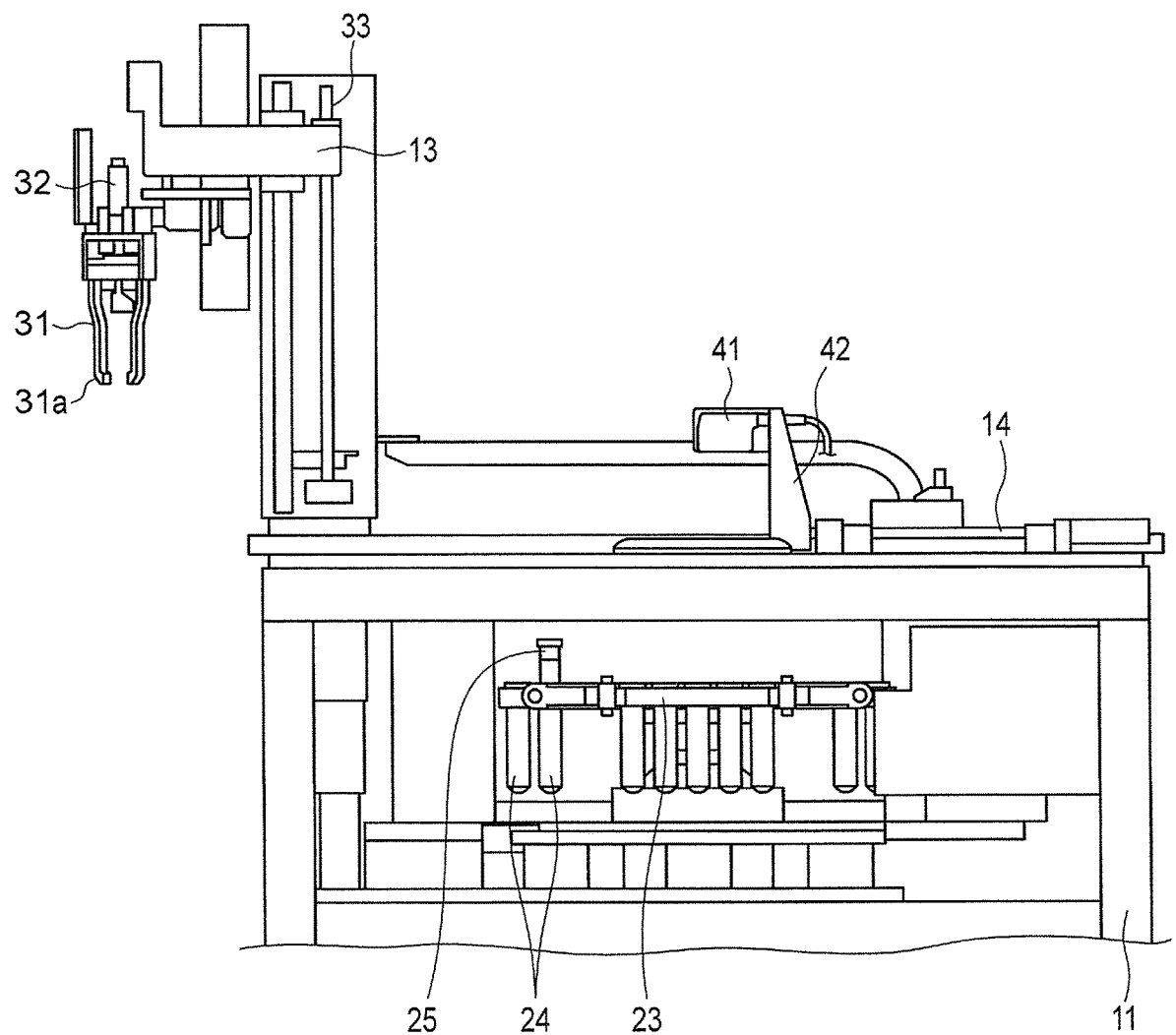
FIG. 9 is a diagram for explaining the imaging process by the sample processing method.

A sample processing apparatus 1 and a sample processing method according to an embodiment of the invention will be described with reference to FIGS. 1 to 15. FIG. 1 is a plan view including a centrifugal separation apparatus 10 according to a first embodiment of the invention, and FIGS. 2 and 3 are perspective views each showing a part of this centrifugal separation apparatus 10. FIG. 4 is a plan view showing a part of the centrifugal separation apparatus 10. FIGS. 5 and 6 are diagrams for explaining an installation process by a sample processing method according to the embodiment, and FIGS. 7 and 8 are diagrams for explaining an imaging process. FIG. 9 is a diagram related to a retracting movement. FIGS. 10 to 14 are diagrams for explaining a determination process. FIG. 15 is a flowchart showing the determination process by the sample processing method. Note that, for the sake of explanation, the drawings may each show the components in an enlarged size or a reduced size as appropriate, or may omit the components as appropriate. Arrows X, Y, and Z in the drawings represent three directions orthogonal to one another. For example, the X direction, the Y direction, and the Z direction conform to a first direction, a second direction, and a third direction, respectively.

As shown in FIGS. 1 to 5, the sample processing apparatus 1 includes the centrifugal separation apparatus 10, a conveyance apparatus 20, and a control apparatus 50. In the sample processing apparatus 1, the conveyance apparatus 20 conveys subject workpieces to the centrifugal separation apparatus 10, and the centrifugal separation apparatus 10 subjects the workpieces to a centrifugal separation process. Examples of the workpieces here include sample containers 25. Each sample container 25 is, for example, a test tube such as a vacuum blood collection tube for containing blood, blood serum, or the like, which may be a transparent cylindrical container having a bottom. The sample container 25 has an opening at its top, onto which a detachable cap 25a is placed. The sample container 25 has a side portion on which various data items such as identification information of the corresponding sample are printed in the form of a barcode or characters, or on which a label carrying such printed data items is affixed.

The centrifugal separation apparatus 10 includes a housing 11, a centrifugal separator 12 arranged within the housing 11, a transfer mechanism 13 for moving workpieces to and from the conveyance apparatus 20, an image sensor 14 serving as an imaging unit, a display unit 15, and an operation unit 16. The centrifugal separation apparatus 10 is disposed on a portion of the side face of the conveyance apparatus 20, for example, on the central part of one Y-direction side of the conveyance apparatus 20.

The housing 11 has, for example, a shape of a rectangular box. The housing 11 accommodates the centrifugal separator 12 within it. The housing 11 has an opening 11a in its top wall. The housing 11 is provided with a lid 11b for exposing and covering the opening 11a. The housing 11 supports the transfer mechanism 13 and the image sensor 14 on its top. For an exemplary implementation, the housing 11 may include a cover member for covering, from above, the transfer mechanism 13, the image sensor 14, etc.

In one example, the opening 11a is arranged at the region that faces, in the Z direction, a part of a rotary frame 22 which is a rotating member provided in the centrifugal separator 12. According to one exemplary form of the present embodiment, the opening 11a is located above one swingable holder 23 and has a shape of a rectangle that covers the region corresponding to the swingable holder 23.

The lid 11b is adapted to move along the top wall of the housing 11 so as to expose and cover the opening 11a.

The housing 11 permits the sample containers 25 to be inserted into buckets 24 serving as retainers, through the opening 11a. More specifically, the opening 11a is formed so that an installation process can be performed where the sample container 25 grasped by a hand arm 31 of the transfer mechanism 13 is installed into the bucket 24 of the centrifugal separator 12 within the housing, and a discharge process can be performed where the hand arm 31 grasps and releases the sample container 25 once installed into the bucket 24.

The centrifugal separator 12 includes a motor 21, the aforementioned rotary frame 22 serving as a rotating member coupled to the main shaft of the motor 21 for rotation, one or more swingable holders 23 swingably attached to the peripheral end of the rotary frame 22, and the multiple buckets 24 provided at each swingable holder 23.

The motor 21 is arranged within the housing 11. The motor 21 is connected to a power supply. The motor 21 is driven under the control of a control unit 51 so as to rotate the rotary frame 22 coupled to its main shaft. The main shaft of the motor 21 extends upward in the Z direction while being coupled with the rotary frame 22.

The rotary frame 22 is arranged at a position above the motor 21 and rotatably coupled to the main shaft of the motor 21. The rotary frame 22 is provided with one or more swingable holders 23 to which the multiple buckets 24 are attached. In an exemplary form of the present embodiment, four swingable holders 23 are swingably supported at the respective periaxial positions on the outer circular rotating trajectory of the rotary frame 22, each along the corresponding tangent line in the rotating direction of the rotary frame 22.

Each swingable holder 23 may include the multiple buckets 24. In one example, each swingable holder 23 has a total of ten buckets 24 arranged in two rows and five columns. Note that the arrangements, the numbers, etc. of the swingable holders 23 and the buckets 24 are not limited to these, but may be discretionarily changed.

The swingable holders 23 are attached to the rotary frame 22 in such a manner that they are each capable of swinging movement. Each swingable holder 23 includes, on its upper peripheral face, a pair of shaft pins protruding outward. With these shaft pins supported by the rotary frame 22, the rotary frame 22 carries the swingable holder 23 in a swingable manner.

The swingable holder 23 is adapted so that, upon exertion of the centrifugal force caused by rotation of the rotary frame 22, the bottom of each bucket 24 is swung up outwardly and the axis of the bucket 24 is aligned with the horizontal direction.

Each bucket 24 is, for example, a cylindrical aluminum tube having a bottom and an open top, forming a columnar insertion space 24a. The bucket 24 is adapted so that the sample container 25 can be inserted into it. The bucket 24 includes a retaining mechanism to secure the sample container 25 in the insertion space 24a.

As shown in FIGS. 2 to 8, the transfer mechanism 13 includes the hand arms 31 mentioned above, a cylinder mechanism 33 for causing the hand arms 31 to ascend and descend, and an electrically operated belt conveyor mechanism 34 for causing one or more hand units constituted by such hand arms 31 and cylinder mechanism 33 to move back and forth in the Y direction for a given distance. The transfer mechanism 13 is supported by the housing 11 and moves the hand arms 31 biaxially in the Y and Z directions or triaxially in the X, Y, and Z directions, while causing each hand arm 31 to open and close.

The hand arms 31 include multiple opening/closing claws 31a adapted to grasp a set of adjacent sample containers 25 containing the respective samples (five sample containers in this exemplary embodiment) at a time, and cylinder mechanisms 32 for opening and closing the claws 31a. The transfer mechanism 13 moves the sample containers 25 between a pickup position P0 located on the conveyance path in the conveyance apparatus 20 and an installation position P1 located in the centrifugal separation apparatus 10. For the installation process, the hand arms 31 insert the conveyed multiple sample containers 25 into the multiple buckets 24 placed at the installation position P1. Note that the installation position P1 corresponds to the insertion spaces in the respective buckets 24, positioned within the opening 11a of the housing 11 and below the top wall of the housing 11. An imaging position P2 is set above the installation position P1. In the present embodiment, an imaging operation is performed at the imaging position P2 by facing down toward the installation position P1, so that the buckets 24 and the sample containers 25 located in the target area are imaged.

The image sensor 14 includes a sensor head 41 for imaging the samples and acquiring image information, and a movement unit 42 for movably supporting the sensor head 41. Examples of the image sensor 14 include an AI-mounted image discrimination sensor, IV2-G300CA, available from Keyence Corporation. The image sensor 14 is connected to a sensor processing unit 43 provided in the control apparatus 50.

In one example, the sensor head 41, serving as an imaging unit, includes a camera with an image sensor. The sensor head 41 is operated under the control of the control unit 51 and images the target area at a predetermined timing after the installation and before the rotation.

The movement unit 42 includes a support 42a and a variable length arm 42b for moving the support 42a. The variable length arm 42b extends along the Y direction. With the stretching and contracting actions of the variable length arm 42b, the sensor head 41 can be moved back and forth in the Y direction.

The movement unit 42 moves the support 42a under the control of the control unit 51 so as to move the sensor head 41 back and forth between the imaging position P2 and a standby position P3. In one example, the imaging position P2 is set above the opening 11a, and the focal distance and the field angle of the sensor head 41 are adjusted so that all the installation subjects, i.e., the buckets 24 and the workpieces (the sample containers 25), will be included in one image taken from above. Note that the number of subjects measured in one operational step may be discretionarily adjusted by a user setting, but the present embodiment will assume an example where five subjects in one row are measured for each operational step. It is also possible to adjust the measurement subjects without changing the position of the sensor head 41 by, for example, switching a program for the image sensor 14 so as to set the focal distance and the field angle that enable one image to include, e.g., ten workpieces or ten sample containers 25. The standby position P3 for the sensor head 41 is set at a position not interfering with the arms, workpieces, etc. In this exemplary embodiment, the standby position P3 for the sensor head 41 is set at a position separated from the imaging position P2 by a predetermined distance in the Y direction and also by another predetermined distance in the direction opposite to the conveyance apparatus 20.

The display unit 15 is, for example, a display device or an indicator for presenting information such as images and determination results. FIGS. 10 to 13 each show an exemplary display screen of the display unit 15. In one example, the display unit 15 presents, via its display screen, an acquired detection image 101, individual determination results 102a to 102e (individual state determination results) in the respective windows set for the multiple installation subject buckets 24, an overall determination result 103 for the installation process, an apparatus operation state 104, an operation command 105, and so on. Here, the windows are assigned identification numbers indicative of individual regions corresponding to the respective buckets 24. As one example, each of the individual determination results 102a to 102e is constituted by items displayed in a given layout, which include the identification number assigned to the window in association with the corresponding individual region, a numerical value or a graph representation showing an individual degree of agreement, a state determination result (OK/NG) based on the individual degree of agreement, and so on.

The operation unit 16 includes components such as a power source and input devices including various operation buttons and an operation panel.

The conveyance apparatus 20 is disposed on the processing line, where the samples are subjected to biochemical analysis, pre-processes, etc. The conveyance apparatus 20 may, for example, form a predetermined portion of the processing line for conducting the biochemical analysis, the pre-processes, etc. for the samples. The conveyance apparatus 20 includes, on its top, a conveyance mechanism 61 for conveying the sample containers 25 along a predetermined conveyance path or paths.

In the conveyance mechanism 61, sample holders 26 holding the sample containers 25 are conveyed along the predetermined conveyance path or paths. The conveyance mechanism 61 includes a belt conveyor 62, guide rails 63 constituted by a pair of rail members, and a drive mechanism for driving the belt conveyor 62. The sample holders 26 hold the respective sample containers 25 in their upright orientation, and are set on the conveyance mechanism 61 for sequential delivery. Each sample holder 26 includes, for example, a holder base 26a having a columnar insertion space into which the sample container 25 can be inserted, and a holding mechanism for holding the sample container 25. In one example, the holding mechanism is constituted by multiple elastic holding pins standing in an annular arrangement so that the inserted tube is clutched through its outer surface by means of the elastic force produced by the deformed holding pins.

The conveyance mechanism 61 may include multiple conveyance paths. For example, the conveyance mechanism 61 includes multiple main lines A1 extending in the X direction from one side to the other side, a feed line A2 branching off from a given position on the main lines A1 and extending up to the pickup position P0, a discharge line A3 extending from the pickup position P0 to a given position on the main lines A1, and a buffer line A4 branching off from a feed side part of the pickup position P0. Here, the sample container 25 flowing on one main line A1 is routed to the feed line A2 and reaches the pickup position P0, where it is grasped by the transfer mechanism 13 and installed into the centrifugal separation apparatus 10. Also, after the centrifugal separation process, the sample container 25 is returned to the pickup position P0 and routed to the discharge line A3 branching off from the downstream side of the pickup position P0. The sample container 25 is then sent downstream and consequently discharged from the downstream end of one main line A1. The buffer line A4 provides room for the sample containers 25 which are waiting for their centrifugal separation process.

The control apparatus 50 includes the aforementioned sensor processing unit 43 and control unit 51 (data processor), and also a storage unit 52.

The sensor processing unit 43 may be, for example, a sensor amplifier and includes processing circuitry for performing various data processes. In one example, the sensor processing unit 43 is mounted on the control apparatus 50. The sensor processing unit 43 is connected to the image sensor 14 and performs various data processes such as arithmetic operations, discrimination operations, etc. on the image data from the image sensor 14. The sensor processing unit 43 detects the state of a workpiece based on a degree of agreement between a detection image and reference data. For example, the sensor processing unit 43 determines, after the installation process, the state of a workpiece (the sample container 25) based on the degree of agreement between the reference data obtained from one or more images registered by a user in advance and the detection image acquired by the image sensor 14. The sensor processing unit 43 sends processing data including the determination result to the control unit 51. Note that the reference data may be the registered image itself, or it may be the registered image subjected to automatic adjustment. The reference data may also be a reference image generated by combining multiple registered images, or data prepared or created based on one or more registered images. The present embodiment will assume use of the reference data which is, as one example, a registered image showing the state where the sample containers 25 have been properly installed in all of the respective subject buckets 24. The detection image is, for example, an image acquired by imaging the target area from above, which covers the sample containers 25 uprightly retained at the installation position P1 corresponding to the imaging position. Note that the sensor processing unit 43 may instead be provided in the image sensor 14 by, for example, being mounted on the sensor head 41.

In an exemplary implementation, the sensor processing unit 43 may use an AI trained and mounted thereon. The sensor processing unit 43 thus has various AI-based functions such as an auto-recognition function, an auto-setting function, an auto-adjustment function, and an auto-discrimination function. The sensor processing unit 43 adjusts determination criteria for the degree of agreement, or adjusts the reference data, based on determination items including at least one of a color, a contour, a color area, and/or an edge.

In one example, the sensor processing unit 43 performs image processing and data processing with the registered images and the detection image so as to extract features of a workpiece and to accordingly recognize the workpiece automatically. Also, the sensor processing unit 43 performs image processing and data processing with the registered images and the detection image so as to automatically set and adjust parameters, values, etc. forming the determination criteria for the degree of agreement. The sensor processing unit 43 sends data including one or more individual state determination results to the control unit 51. As one example of the state determination process, in response to detecting that the degree of agreement between the registered image and the detection image is high, an "OK" determination is made as a determination of a proper state where the sample container 25 is placed in an intended orientation. On the other hand, in response to detecting that the degree of agreement is low, an "NG" determination is made as a determination of an abnormal state where the sample container 25 is not placed in the intended orientation. Here, examples of the abnormal state include a state where the sample container 25 is not provided (that is, the sample container 25 is absent), a state where the sample container 25 is irregularly oriented or dislocated, e.g., is tilted or sticks out, and so on.

The control unit 51 is connected to the driver of each mechanism, etc. in the centrifugal separation apparatus 10 and the conveyance apparatus 20. The control unit 51 is constituted by, for example, processing circuitry including a processor, and controls each component according to an operating system or application program so that various functions of the sample processing apparatus 1 are realized. The control unit 51 is, for example, a programmable logic controller (PLC). In one example, the control unit 51 is connected to various detecting devices including the image sensor 14, a position sensor, etc., arranged at portions of the centrifugal separation apparatus 10, and also to the drive mechanisms such as a motor and a cylinder mechanism of each component. The control unit 51 is adapted to perform calculation processing, data processing, etc. according to a predetermined program or programs using one or more of the state determination results from the sensor processing unit 43, detection data acquired at each detection device, various data sets stored in the storage unit 52, and so on, so that it can control the operations of the sample processing apparatus 1 through driving of the drive mechanisms such as a motor and a cylinder mechanism in the centrifugal separation apparatus 10 and the conveyance apparatus 20.

The storage unit 52 includes, for example, one or more storage devices which may be a RAM, a ROM, etc., and stores various setting values, operational expressions, and so on. In one example, the storage unit 52 stores information including images from the image sensor 14, determination results for workpieces such the degree of agreement, and so on.

Various means for driving as described above, such as a motor and a cylinder mechanism provided in each component of the sample processing apparatus 1, are each connected to the control unit 51 and operated at given timings under the control of the control unit 51.

Next, the sample processing method according to the embodiment will be described with reference to FIGS. 5 to 15.

The sample processing method according to the embodiment covers, as one example, a centrifugal separation method which includes an installation process, an imaging process, a determination process, an error reporting process, and a rotation process. According to one exemplary form of the method, the sample processing apparatus 1 sequentially installs the sample containers 25 into the rotary frame 22 of the centrifugal separator 12 from the conveyance apparatus 20 disposed in the course of the processing line, where the samples undergo various processes such as biochemical analysis and pre-processes.

The centrifugal separation process is performed for a predetermined period, and then the sample containers 25 are sequentially taken out and returned to the processing line at the conveyance apparatus 20.

As one example, the description will assume a configuration where the rotary frame 22 is provided with four swingable holders 23 each having ten buckets 24 arranged in five columns and two rows, and the installation process and the determination process are performed for each row, that is, for a set of five buckets 24, which is a half.

The control unit 51 conducts the installation process by controlling the transfer mechanism 13 to grasp the sample containers 25 located at the pickup position P0 which may be construed as a standby position in the conveyance path (ST1), move the sample containers 25 (ST2), and insert the sample containers 25 into the respective buckets 24 located at the installation position P1 in the housing 11 (ST3).

For example, by use of the transfer mechanism 13, each sample container 25 is taken from the pickup position P0 on the conveyance line and installed, via the opening 11*a*, into the corresponding bucket 24 of the centrifugal separator 12 at the installation position P1 directly below the imaging position P2.

More specifically, the control unit 51 drives the belt conveyor mechanism 34 and the cylinder mechanisms 32 and 33 so that the hand arms 31 are moved to the pickup position P0 and then descend to grasp the five sample containers 25 arranged at the pickup position P0. The hand arms 31 are lifted and moved to the position directly above the installation position P1. Subsequently, the hand arms 31 are caused to descend, thereby inserting the sample containers 25 into the respective subject buckets 24 among the multiple buckets 24, namely, five buckets 24 constituting a half of the buckets 24.

Upon completing the installation of one set, the control unit 51 conducts the imaging process by controlling the transfer mechanism 13 to retract to a safe position (ST4) and moving the sensor head 41 to the imaging position P2 directly above the installation position P1 (ST5), so that the sensor head 41 images the area of the below installation position P1 from the imaging position P2 to acquire image information (ST6).

Upon finishing the imaging, the control unit 51 returns the sensor head 41 to the standby position P3 (ST7).

The control unit 51 then determines a success or a failure of the installation process based on the detection image acquired by the image sensor 14 (ST8), and controls the display unit 15 to display the determination result (ST9).

If, as an overall determination, it is determined that the installation process was properly done (ST10, "Yes"), the control unit 51 further conducts the installation process for the next set, assuming that the conducted installation process was a success. Upon completing the installation process, etc. for one swingable holder 23, the control unit 51 drives the motor to rotate the rotary frame 22 by 90 degrees so that another swingable holder 23 is set to the installation position P1 for the next ten sample containers 25 to be similarly installed. This is repeated for the remaining swingable holders 23. With the similar installation processes, etc. conducted, the sample containers 25 are installed into the buckets 24 of the swingable holders 23 throughout the circumference of the rotary frame 22.

In repeating the installation process, the imaging process, and the determination process as described above, the state determination and the overall determination may be performed for each installation process. When the installation process determined to be proper is conducted a predetermined number of times, or when the installation, imaging, and determination processes for the swingable holders 23 are completed for the entire circumference of the rotary frame 22 (ST11), the centrifugal separation process is performed with the lid closed (ST12). As the centrifugal separation process, the control unit 51 causes the rotary frame 22 of the centrifugal separator 12 to rotate at a given timing so that the samples are subjected to centrifugal separation. Upon the elapse of a predetermined rotation period, the rotation of the rotary frame 22 is stopped and the sample containers 25 are sequentially taken out and returned to the processing line. These installation, imaging, and determination processes may be conducted for two rows at a time. If the installation count does not reach a predetermined number within a predetermined time period, the processing flow may advance to the centrifugal separation process by determining a time-out for the installation process, etc.

On the other hand, if an installation error is detected in the determination process by the control unit 51 (ST10, "No"), a reporting process and/or a stop process are conducted (ST13). Examples of the reporting process include an output of an error warning through indication on the display screen of the display unit 15 provided on the housing 11, or through a buzzer provided separately. In the stop process, for example, the operation of the entire apparatus is halted tentatively. Error indication is given via the display screen so that an operator is prompted to take measures for solving the error. When, in response to the warning, the operator removes the cause of the error and performs an error cancellation input action on the operation unit 16 (an operation panel), the apparatus resumes its operation after checking the installation state again with the image sensor and confirming the proper state. If the cause of the error is not removed, the error is detected again and the apparatus does not resume.

An exemplary form of the determination process in step ST8 will be described. Here, the description will assume the following exemplary instance as a case of determining a success or a failure. The sensor processing unit 43 determines the states (OK/NG) of the sample containers 25 at their individual areas corresponding to the respective buckets 24. The control unit 51 checks or matches the installation count based on the information from the sensor processing unit 43 and/or information such as an installation command, and determines a success or a failure (OK/NG) as an overall determination for the installation process by taking into account events such as a dropping of the sample, etc.

The sensor processing unit 43 performs the state determination as to whether or not each workpiece is put in the proper position based on the degree of agreement between the reference data obtained from an image or images registered in advance and the detection image obtained by imaging. At this time, the sensor processing unit 43 automatically sets and adjusts items (tools), threshold values, etc., that constitute the determination criteria, by utilizing its AI-based auto-recognition function, auto-setting function, and auto-adjustment function.

The registered image may be, for example, an image showing the state where the sample containers 25 have been properly installed in all of the respective subject buckets 24. Note that the registered image may be an image taken without the workpieces such as collection tubes. In one example, a user registers workpieces individually in accordance with operational specifications (e.g., test tubes to be used). Note that the user may register more than one image as the registered images. For example, an OK image and an NG image may both be registered.

In one example, the installation and measurement are performed for a measurement region covering five buckets 24 as one set. There are, for example, two patterns of the measurement region according to the two rows, and the programs for the image sensor may be switched to correspond to the form of installation. The two rows may be collectively handled as one set. Each measurement region is divided into multiple sub-regions serving as individual regions corresponding to the respective buckets 24 as the subjects for installation, and the state determination is performed for each of such individual subjects for installation.

For example, in the state determination, the sensor processing unit 43 performs an auto-recognition process for recognizing the features of a workpiece using the image processing algorithms of AI. The auto-recognition process includes detecting data for multiple items such as "color extraction", "contour detection", "color area", and "edge detection", and recognizing the workpiece in these multiple items.

The sensor processing unit 43 in its determination process selects the items (tools) constituting the determination criteria and adjusts the parameters. In one example, the sensor processing unit 43 automatically selects and sets the determination criteria-constituting items from the multiple items including "color extraction", "contour detection", "color area", and "edge detection" (i.e., auto-tuning). For example, workpieces occasionally vary in height, shape including a cap shape, color, etc., but the auto-recognition function of the sensor processing unit 43 allows for the recognition of a workpiece by adjusting the extracted features or values of the workpiece even when it differs from the workpiece used for the advance registration.

Note that the sensor processing unit 43 may also automatically select and set, based on one or more OK images and one or more NG images registered by a user, the determination criteria-constituting items (tools) that give a high degree of agreement with the registered NG workpiece information and a low degree of agreement with the registered OK workpiece information.

Each determination criteria-constituting item may be an independent measurement algorithm which is set separately from the others. Selections and value adjustment for these determination criteria-constituting items are performed by the sensor processing unit 43. That is, in the sensor processing unit 43, the AI selects a combination of the determination criteria-constituting items, and automatically and optimally adjusts the setting values (thresholds) for the determination criteria-constituting items so as to recognize and discriminate one workpiece.

Note that it is also possible to set multiple selectable operation modes such as an auto-adjustment mode in which parameters for the determination criteria-constituting items (tools) are automatically adjusted and a fixed mode in which the auto-adjustment is not performed. In this case, the mode is either manually set by a user operation or automatically set.

The sensor processing unit 43 detects the degree of agreement between a detection image and a registered image or reference data obtained from the registered image, according to the automatically set items or parameters. Here, in one example, the sensor processing unit 43 detects the degree of agreement for each individual bucket 24 serving as a retainer and makes a state determination for each bucket 24 after the installation process, for example, a determination as to whether or not the workpiece is properly put in the intended position or whether or not the workpiece is present. In other words, the sensor processing unit 43 sets individual regions and individual windows corresponding to the respective buckets 24 together with identification numbers as seen in each of the display screens shown in FIGS. 10 to 13, so as to perform individual state determinations.

Figure 10:
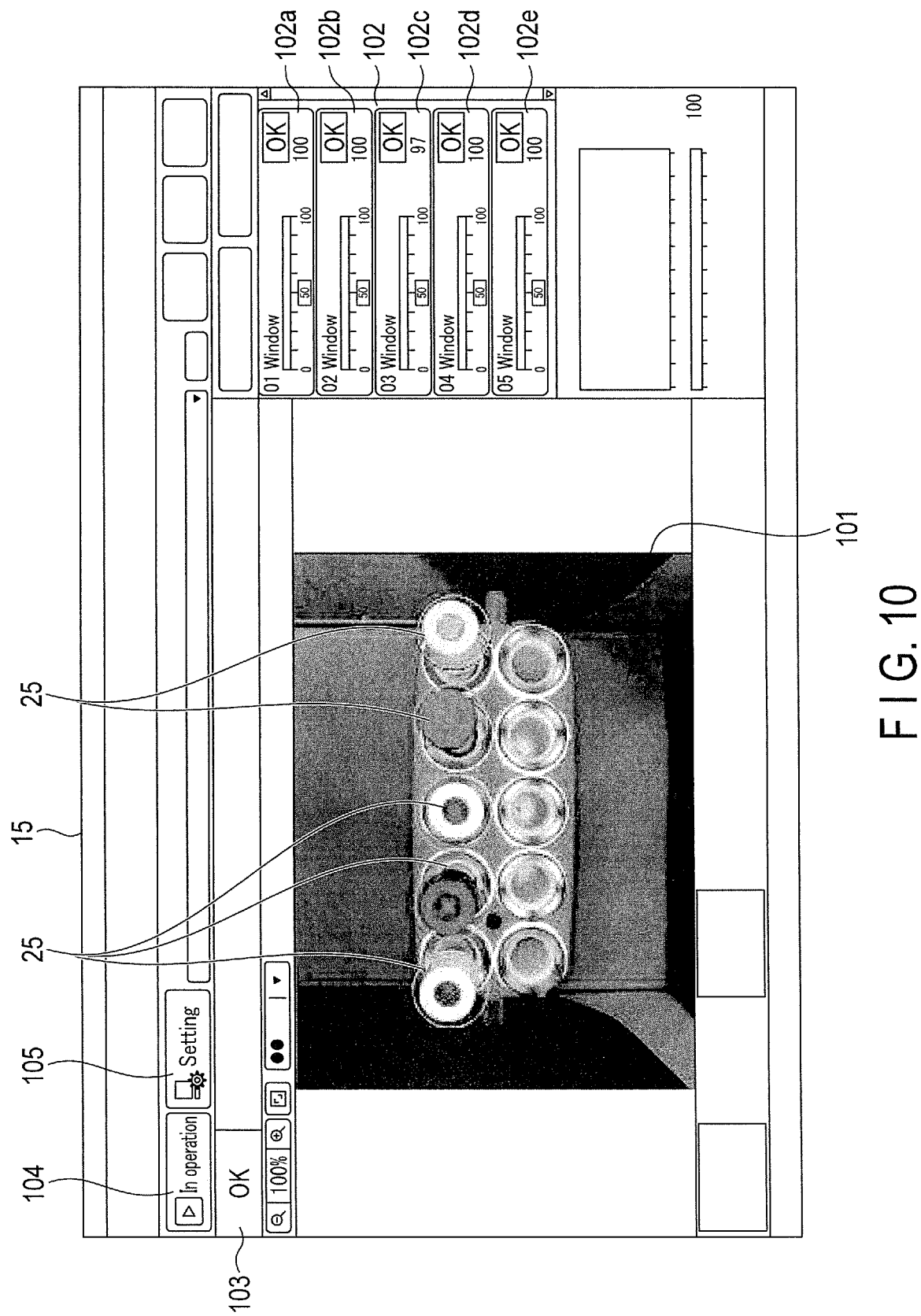
FIG. 10 is a diagram for explaining a determination process by the sample processing method.
Figure 11:
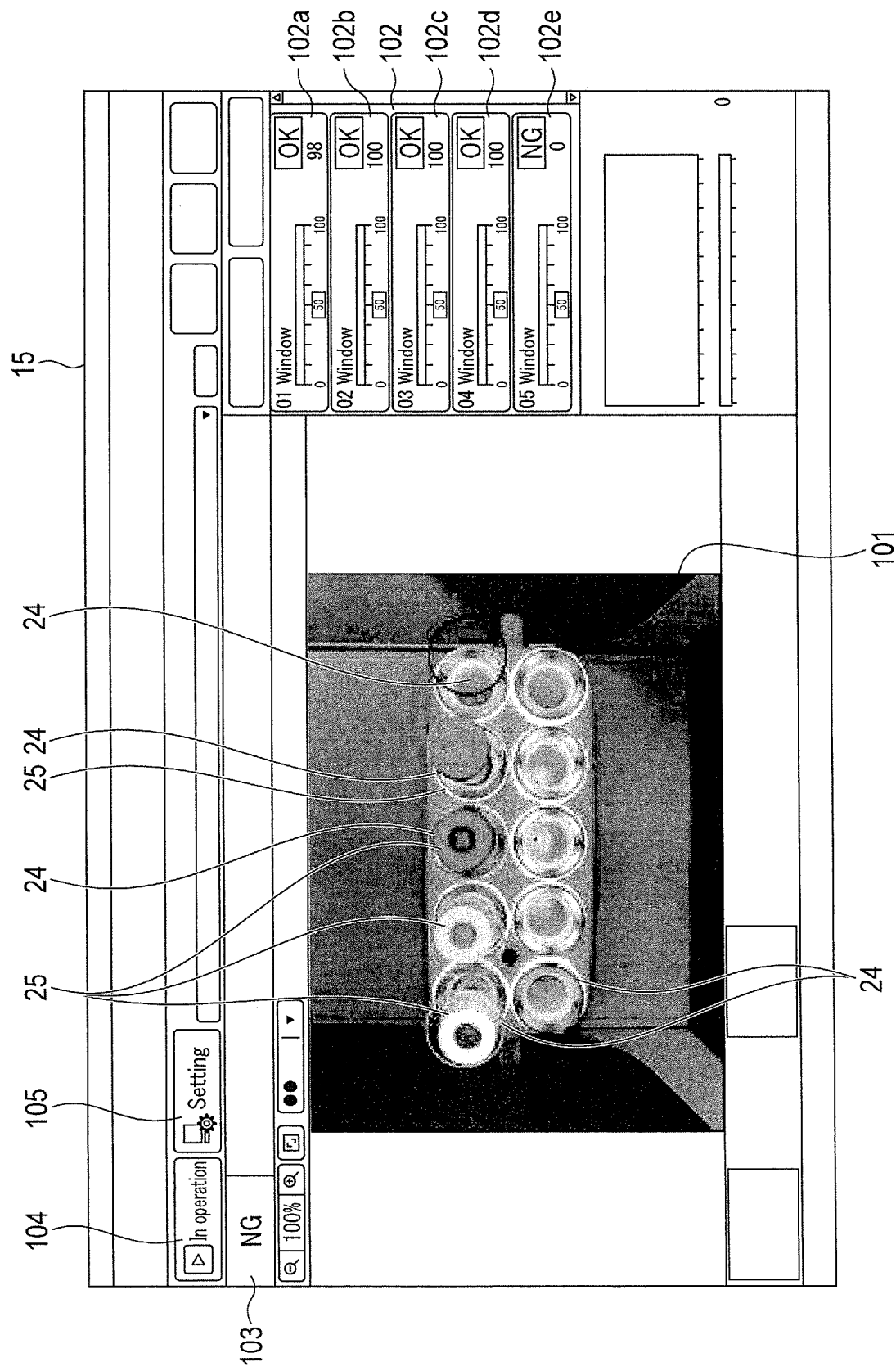
FIG. 11 is a diagram for explaining the determination process by the sample processing method.
Figure 12:
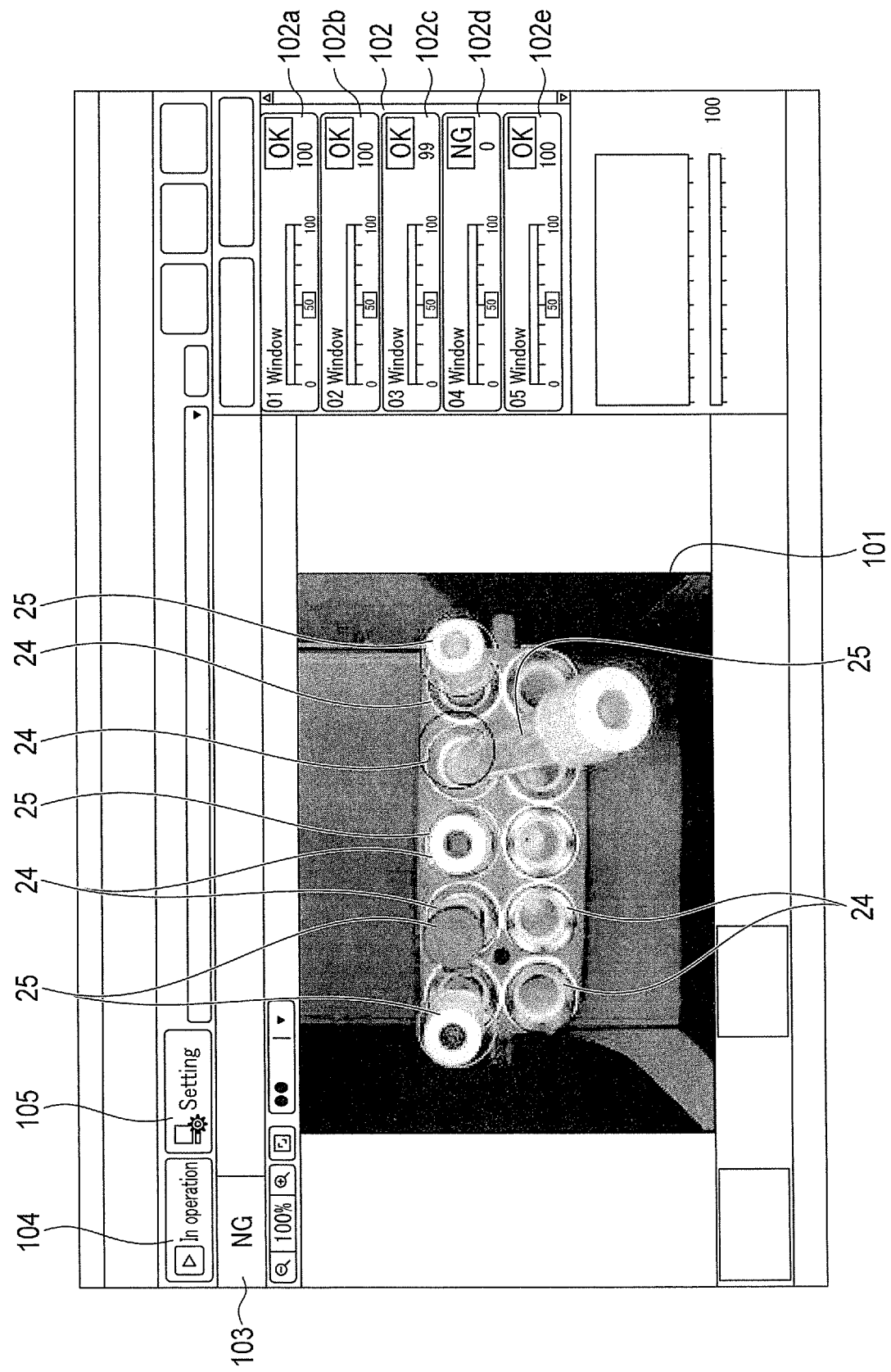
FIG. 12 is a diagram for explaining the determination process by the sample processing method.
Figure 13:
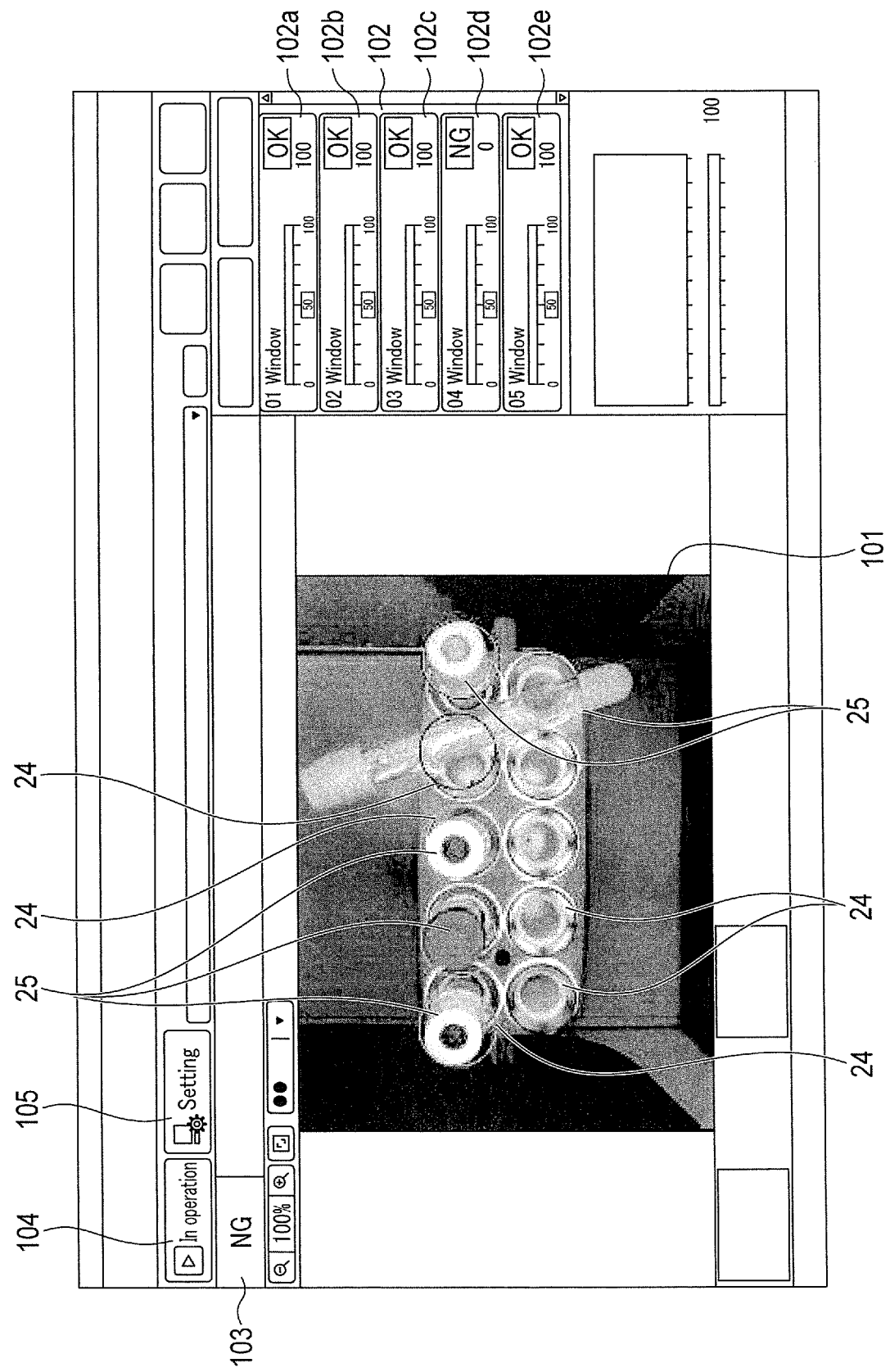
FIG. 13 is a diagram for explaining the determination process by the sample processing method.

For example, in the state where the sample containers 25 are put in the buckets 24 in a proper orientation as shown in FIG. 10, the degree of agreement with the registered image, e.g., an OK image, is high, and an OK determination is made. In the state where there is a bucket 24 in which the sample container 25 is absent as shown in FIG. 11, the degree of agreement with the registered image, e.g., an OK image, is low, and an NG determination is made. Further, in the state where the sample container 25 is, for example, tilted or sticks out from the bucket 24 as shown in FIG. 12 or 13, the degree of agreement with the registered image, e.g., an OK image, is low, and an NG determination is made.

The sensor processing unit 43 then sends data including such individual determination results to the control unit 51. Note that the sensor processing unit 43 uses the degree of agreement as a numerically represented basis for its determination, and such numerical values are presented through, for example, the display unit 15. These data items may instead or additionally be stored in, for example, the storage unit 52.

The control unit 51 makes an overall determination for the installation process based on the information from the sensor processing unit 43. In one example, the control unit 51 matches the results of sample state determinations for the respective buckets 24 against an installation command, and determines particulars about an installation error as an overall determination (an overall determination process). The control unit 51 presents its determination result through, for example, the display screen.

Figure 14:
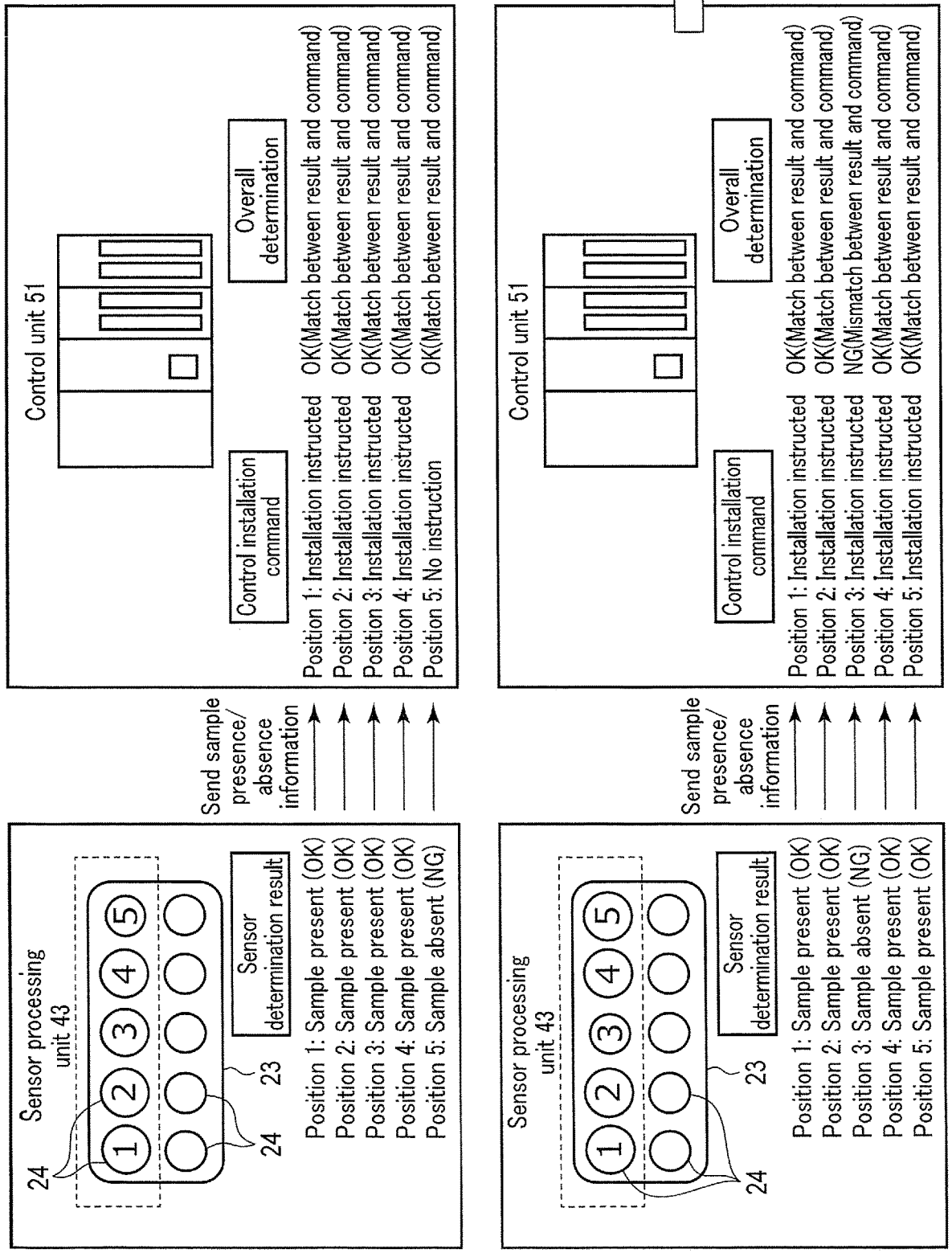
FIG. 14 is a diagram for explaining the determination process by the sample processing method.
Figure 15:
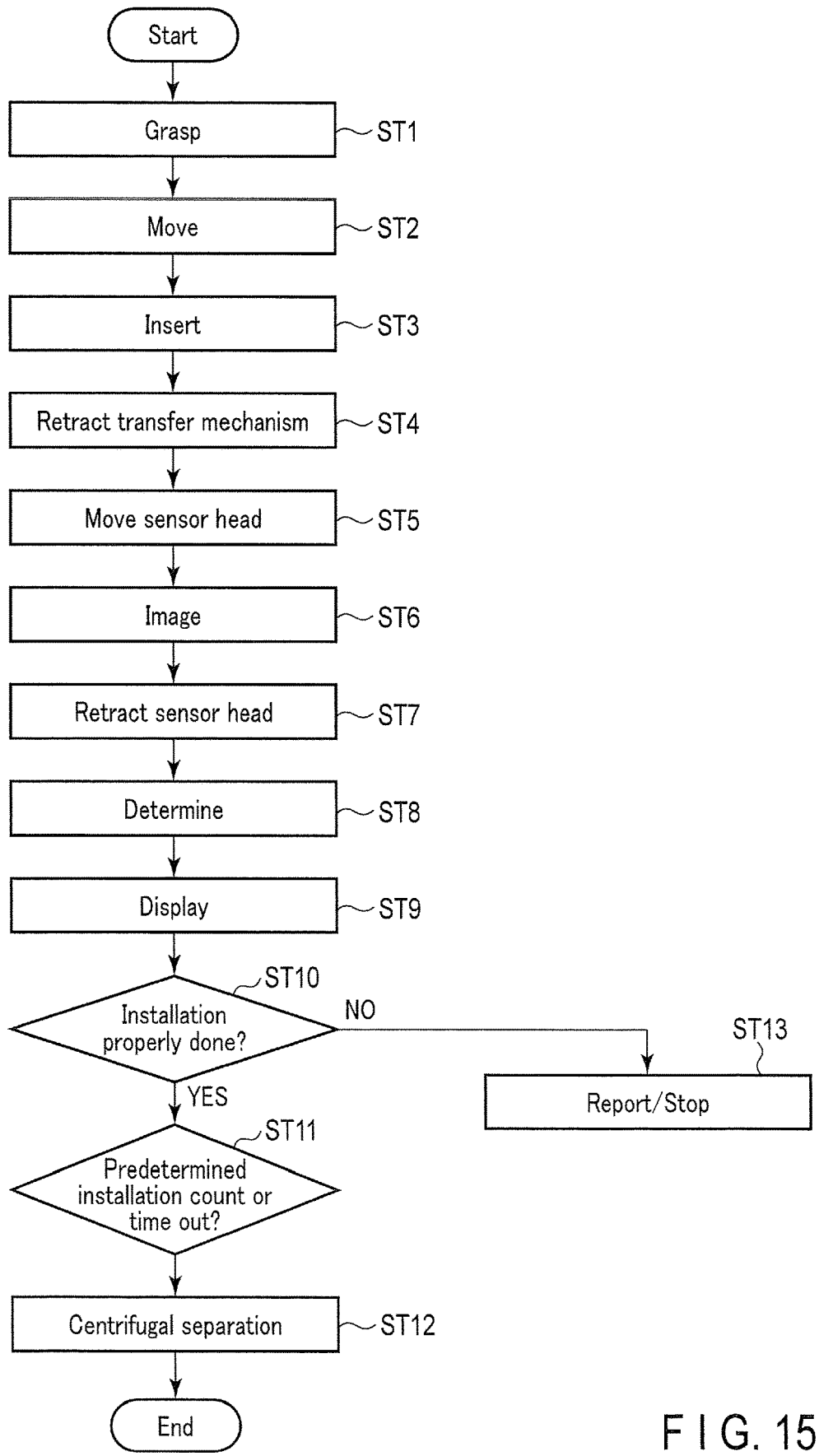
FIG. 15 is a flowchart showing the determination process by the sample processing method.

As shown in FIG. 14, the control unit 51 matches the individual state determination results against corresponding information in the installation command to determine whether or not the installation process has involved an error. For illustration, FIGS. 10 to 14 will be referred to. Among the individual determination results 102a to 102e for the respective individual regions, the result showing an NG determination for its bucket 24 is matched against the installation command. If the sample is found to be not present despite the installation command instructing the corresponding installation, an NG determination is made as the overall determination. If, on the other hand, there is no instruction for the installation into this bucket 24, an OK determination is made as the overall determination irrespective of the individual determination being "No Sample", i.e., an NG individual determination. One or more NG determinations made for one image, that is, one installation process, are judged as representing the occurrence of one or more installation errors in the installation process, such as a drop, tilting, etc. of the sample containers.

The centrifugal separation apparatus 10 according to the embodiment offers various effects and advantages. Specifically, it enables a centrifugal separation apparatus to detect the state of each sample container using an image obtained through an opening immediately after the installation. Therefore, even a centrifugal separation apparatus that does not permit a sensor arrangement within its housing due to lack of a sufficient space or due to a presence of a high-speed rotating member can realize stable state detection. Turning to a sensor, for example, a photoelectric sensor having a long detection range may be employed in place of the image sensor at the same position. However, the photoelectric sensor must assume many uncertainties influencing the detection, such as differences (shape and color variations) in caps of test tubes. Thus, use of a photoelectric sensor may not secure stable state detection when, for example, a cap reduces (or varies) the reflective ratio of the sensor projecting light. Use of an image sensor can clear the arrangement requirements and also realize stable state detection by utilizing image processing techniques. In addition, the imaging unit is reciprocated between the imaging position and the standby position so that it does not interfere with the arm for installation processes. Thus, the imaging unit can acquire images without blocking the installation processes for centrifugal separation, and accordingly, without deteriorating the processing capacity. As the image sensor, an AI-mounted image sensor having a sensor learning function is used so that a variety of workpieces can be registered, recognized, and discriminated by auto-adjustment. This can, for example, eliminate the necessity of registering the features of each workpiece by special technical staff, and the AI-based setting can facilitate the worker operations. Moreover, the image sensor enables comprehensive determination to be made based on multiple factors found in the imaging data.

Since the image sensor allows for the adjustments to address variations including individual differences between subjects, changes in environment, etc., the detection stability can be enhanced. Also, the AI-based auto-feature detection facilitates the registration of workpieces (e.g., test tubes) so that instances where different workpieces (test tubes) are used for respective users can be flexibly addressed. Accordingly, state detection can be performed without being influenced by individual differences, environmental factors, backgrounds, etc. With the auto-setting, auto-recognition, and auto-discrimination functions, it is further possible to prevent error determinations from occurring due to lack of knowledge or experience of the operator.

The centrifugal separation apparatus according to the embodiment includes a sensor and a transfer mechanism, etc. as its components, and therefore, it can be appended to other existing processing apparatuses at a later stage by placing it beside the subject apparatus. Since, for example, a conveyance path is provided on the top and the apparatus is formed as a unit, the apparatus has a high versatility as it can be disposed on the side of the existing conveyance paths.

Note that the present invention is not limited to the foregoing embodiments as they are. For practical implementation, the invention can be embodied with modifications of its components without departing from the gist of the invention.

For example, the foregoing embodiments have assumed an exemplary configuration where the sensor processing unit 43 having AI-based functions sends determination results obtained for a given installation position to the control unit 51, and the control unit 51 makes an overall determination based on the received determination results, but this is not a limitation. It is also possible to adopt a configuration where, for example, the control unit 51 makes determinations including image determinations. Also, the foregoing embodiments have assumed an exemplary arrangement where the sensor processing unit 43 is disposed in the control apparatus 50, but this is not a limitation. It is also possible to adopt an arrangement where, for example, the sensor processing unit 43 is mounted on the image sensor 14. Further, the registered images are not limited to OK images, i.e., images showing a proper state. It is also possible to register one or more NG images showing irregular states as the reference data, or to set the reference data based on both the OK image and the NG image.

Moreover, in the foregoing embodiments, detection of the presence or absence of each sample container may further be performed at the pickup position before the installation process, in addition to the state detection after the installation process. For example, a photoelectric sensor may be provided on the hand arm 31 to detect the presence or absence of the sample containers before the installation. This enables the state detection both before and after the transferring of the sample containers, and therefore, error detection can be conducted with even higher precision.

In addition to the above, the components, etc., discussed for the foregoing embodiments may be suitably omitted, or changes may be suitably made to the shapes, structures, etc. of the components, etc. Furthermore, various inventions may also be formed from appropriate combinations of the components discussed for the foregoing embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

REFERENCE SIGNS LIST

1 . . . Sample processing apparatus, 10 . . . Centrifugal separation apparatus, 11 . . . Housing, 11*a* . . . Opening, 11*b* . . . Lid, 12 . . . Centrifugal separator, 13 . . . Transfer mechanism, 14 . . . Image sensor, 20 . . . Conveyance apparatus, 21 . . . Motor, 22 . . . Rotary frame, 23 . . . Swingable holder, 24 . . . Bucket, 25 . . . Sample container, 26 . . . Holder, 31 . . . Hand arm, 31*a* . . . Opening/closing claws, 41 . . . Sensor head, 42 . . . Movement unit, 42*a* . . . Support, 42*b* . . . Variable length arm, 43 . . . Sensor processing unit, 51 . . . Control unit, 61 . . . Conveyance mechanism, 62 . . . Belt conveyor, 63 . . . Guide rail, P0 . . . Pickup position, P1 . . . Installation position, P2 . . . Imaging position, P3 . . . Standby position

The invention claimed is:

1. A centrifugal separation apparatus comprising:
   a centrifugal separator comprising a retainer and a rotating member for rotation of the retainer, the retainer adapted to retain a workpiece comprising a sample container containing a sample;
   an imaging unit configured to acquire a detection image of an installation position at which the retainer is placed;
   a transfer mechanism configured to move the workpiece into the centrifugal separator;
   a sensor processing unit configured to detect, based on the detection image acquired after an installation process of placing the workpiece into the retainer and before a rotation process of rotating the rotating member, a state of the workpiece subjected to the installation process; and
   a conveyance apparatus arranged on a side of the centrifugal separator and comprising a conveyance mechanism configured to convey a sample holder along a predetermined conveyance path, the sample holder being configured to hold the workpiece in an upright orientation,
   wherein the transfer mechanism is configured to grasp the workpiece held by the sample holder in the predetermined conveyance path and install the workpiece into the retainer in the centrifugal separator.

2. The centrifugal separation apparatus according to claim 1, wherein the sensor processing unit is configured to detect the state of the workpiece based on a degree of agreement between the detection image and reference data.

3. The centrifugal separation apparatus according to claim 2, wherein
   the reference data comprises a reference image based on a previously registered image, and
   the sensor processing unit is configured to adjust determination criteria for the degree of agreement, or adjust the reference data, based on determination items including at least one of a color, a contour, a color area, and/or an edge.

4. The centrifugal separation apparatus according to claim 2, wherein
   the reference data comprises a reference image based on a previously registered image, and
   the sensor processing unit is configured to adjust determination criteria for the degree of agreement, or adjust the reference data, based on determination items including at least one of a color, a contour, a color area, and/or an edge.

5. The centrifugal separation apparatus according to claim 2, wherein
   the centrifugal separator comprises a housing, the housing comprising an opening above the retainer and a lid adapted to expose and cover the opening, and
   the imaging unit is configured to move between an imaging position above the opening and a standby position away from the imaging position.

6. The centrifugal separation apparatus according to claim 3, wherein
the centrifugal separator comprises a housing, the housing comprising an opening above the retainer and a lid adapted to expose and cover the opening, and
the imaging unit is configured to move between an imaging position above the opening and a standby position away from the imaging position.

7. The centrifugal separation apparatus according to claim 1, further comprising a control unit configured to detect an error in the installation process based on the state of the workpiece at the installation position after the installation process, and control the centrifugal separation apparatus based on the detected error.

8. A centrifugal separation method comprising:
grasping a workpiece held by a sample holder in a predetermined conveyance path of a conveyance apparatus, the workpiece being a sample container containing a sample, the sample holder being configured to hold the workpiece in an upright orientation, the conveyance apparatus being arranged on a side of a centrifugal separator and comprising a conveyance mechanism configured to convey the sample holder along the predetermined conveyance path;
installing the workpiece into a retainer provided at a rotating member in the centrifugal separator;
acquiring an image of an installation position at which the workpiece has been installed, from above the installation position;
detecting a state of the workpiece based on the image; and
controlling an operation with the rotating member based on the state of the workpiece.

9. The centrifugal separation method according to claim 8, wherein
the centrifugal separator comprises a housing, the housing comprising an opening above a retainer adapted to retain the workpiece and a lid adapted to expose and cover the opening,
said acquiring the image comprises moving an imaging unit to an imaging position above the opening for imaging, the imaging unit being at a standby position away from the imaging position during installation of the workpiece, and
said controlling the operation with the rotating member comprises,
if the state of the workpiece is detected to be proper, rotating the rotating member for centrifugal separation, and
if the state of the workpiece is detected to be abnormal, conducting one or both of a reporting process and a stop process.

10. A centrifugal separation apparatus comprising:
a centrifugal separator comprising a bucket and a rotary frame the bucket adapted to retain a workpiece comprising a sample container containing a sample, the rotary frame attached to the bucket and configured to rotate;
a camera comprising an image sensor configured to acquire a detection image of an installation position at which the bucket is placed;
a sensor amplifier comprising processing circuitry configured to detect, based on the detection image acquired after an installation process of placing the workpiece into the bucket and before a rotation process of rotating the rotary frame a state of the workpiece subjected to the installation process; and
comprising a sample container containing a sample;
an imaging unit configured to acquire a detection image of an installation position at which the retainer is placed;
a transfer mechanism configured to move the workpiece into the centrifugal separator;
a sensor processing unit configured to detect, based on the detection image acquired after an installation process of placing the workpiece into the retainer and before a rotation process of rotating the rotary frame, a state of the workpiece subjected to the installation process; and
a conveyance apparatus arranged on a side of the centrifugal separator and comprising a conveyance mechanism configured to convey a sample holder along a predetermined conveyance path, the sample holder being configured to hold the workpiece in an upright orientation,
wherein the transfer mechanism is configured to grasp the workpiece held by the sample holder in the predetermined conveyance path and install the workpiece into the retainer in the centrifugal separator.

11. The centrifugal separation apparatus according to claim 1, wherein
the centrifugal separator comprises a plurality of buckets each serving as the retainer and configured to be swingable, and
the transfer mechanism comprises a hand arm configured to grasp, at a time, a plurality of workpieces held by a plurality of sample holders adjacently arranged in the predetermined conveyance path, and move the grasped plurality of workpieces to install into the plurality of buckets.

12. The centrifugal separation apparatus according to claim 1, wherein the state of the workpiece comprises an orientation of the workpiece.

* * * * *